United States Patent [19]

Hunold et al.

[11] Patent Number: 5,266,263

[45] Date of Patent: Nov. 30, 1993

[54] REPROCESSING OF USED EVAPORATION BOATS

[75] Inventors: Klaus Hunold, Lauben; Peter Matje, Wiggensbach, both of Fed. Rep. of Germany

[73] Assignee: Elektroschmelzwerk Kempten GmbH, Munich, Fed. Rep. of Germany

[21] Appl. No.: 967,665

[22] Filed: Oct. 28, 1992

[30] Foreign Application Priority Data

Nov. 22, 1991 [DE] Fed. Rep. of Germany ....... 4138481

[51] Int. Cl.⁵ .................................................. B22F 9/16
[52] U.S. Cl. ....419/31; 419 57; 419 12; 419 13; 75 751
[58] Field of Search .................... 419/57, 31, 12, 13; 501/96; 423/412; 75/751

[56] References Cited

U.S. PATENT DOCUMENTS

| | | | |
|---|---|---|---|
| 2,962,538 | 11/1960 | Alexander et al. | 373/112 |
| 2,984,807 | 5/1961 | Blum et al. | 338/330 |
| 3,181,968 | 5/1965 | Mandorf et al. | 427/566 |
| 3,256,103 | 6/1966 | Roche et al. | 501/98 |
| 3,544,486 | 12/1970 | Passmore et al. | 427/250 |
| 3,582,611 | 6/1971 | Matheson | 392/389 |
| 3,803,707 | 4/1974 | Passmore et al. | 29/611 |
| 3,813,252 | 5/1974 | Lipp et al. | 252/520 |
| 3,915,900 | 10/1975 | Reinmuth et al. | 252/520 |
| 4,089,643 | 5/1978 | Jerabek et al. | 432/262 |
| 4,373,952 | 2/1983 | Parent | 75/244 |
| 4,615,863 | 10/1986 | Inoue et al. | 419/23 |
| 4,847,031 | 7/1989 | Parent et al. | 264/332 |
| 4,847,031 | 7/1989 | Parent et al. | 264/332 |
| 4,865,830 | 9/1989 | Klabunde et al. | 423/12 |
| 5,167,844 | 12/1992 | Uda et al. | 423/12 |

FOREIGN PATENT DOCUMENTS

| | | |
|---|---|---|
| 0429345 | 5/1991 | European Pat. Off. . |
| 0494129 | 7/1992 | European Pat. Off. . |
| 3839730 | 7/1989 | Fed. Rep. of Germany . |
| 2170839 | 9/1973 | France . |
| 2210872 | 6/1989 | United Kingdom . |

OTHER PUBLICATIONS

Data base abstract for EP-A-0429345.
Data base abstract for FR-A-2,170,839.
Data base abstract for EP-A-0494129.

*Primary Examiner*—Donald P. Walsh
*Assistant Examiner*—Anthony R. Chi
*Attorney, Agent, or Firm*—Burgess, Ryan and Wayne

[57] ABSTRACT

The invention relates to the reprocessing of used evaporation boats. This is done by a method which comprises comminuting used, aluminum-contaminated evaporation boats and roasting them in a nitrogen-containing atmosphere.

10 Claims, No Drawings

REPROCESSING OF USED EVAPORATION BOATS

BACKGROUND OF THE INVENTION

1. Field of the invention

The invention relates to one reprocessing of used evaporation boats.

2. Background Art

Evaporation boats are generally used to evaporate metals such as aluminum. Examples thereof are described in the following U.S. Pat. Nos. 4,373,952, 4,089,643, 3,915,900, 3,813,252, 3,803,707, 3,582,611, 3,544,486, 3,256,103, 3,181,968, 2,984,807, 2,962,528.

During the normal operation of evaporation boats, an erosion of the material components of the boat takes place as a result of the interaction with molten aluminum. Although only a small amount of the material components is eroded, the boat loses its serviceability in this way since the effective cross section of the boat and the electrical resistivity are altered. In this case, the boat is normally rejected and replaced after it has usually been worn away by only 10 to 15%.

A method for reprocessing the used evaporators is described in German Offenlegungsschrift 38 39 730 (corresponding to U.S. Pat. No. 4,847,031). According to the method described therein, the used boats, which are as a rule contaminated with fairly large amounts of aluminum, are first treated with hot sodium hydroxide solution in order to remove the aluminum. The boats are then neutralized with hydrochloric acid, washed with water, ground to form a powder and sieved. The sieved powder is used to produce new boats. This method has the following disadvantages:

The three treatment steps for removing aluminum residues from the evaporation boats are very expensive. Fairly large amounts of contaminated hydroxide solutions and acids, and also of solid aluminum-containing waste, are produced. This waste has to be disposed of in an expensive and environmentally polluting way. There is the danger that the material purified by this method is contaminated with alkali metal or OH ions. The latter manifests itself, especially in the case of the oxidation-susceptible, very fine powder, in such a way that the recycled material has higher oxygen values than the original evaporator material. As a result, an evaporator made of recycled material suffers quality losses.

The object of the invention was to provide a method which makes possible an environmentally friendly, low-waste reprocessing of used evaporation boats.

SUMMARY OF THE INVENTION

The object is achieved by a method, which comprises comminuting used, aluminum-contaminated ceramic evaporation boats and roasting then in a nitrogen-containing atmosphere.

DESCRIPTION OF THE PREFERRED EMBODIMENT

Suitable starting materials are all types of used ceramic evaporation boats. The used, electrically conductive, refractory evaporation boats, which are heated by inherent resistance, are usually composed of titanium boride, boron nitride and aluminum nitride, or of titanium boride and boron nitride. Some of them also contain small amounts of other borides, nitrides, carbides, oxides and/or carbon. The used evaporation boats are comminuted using suitable units such as, for example, ball mills, jaw crushers and/or jet pulverizers to particle sizes of less than 1 mm, preferably of less than 100 $\mu$m. The powder so obtained is roasted at temperatures of 400° C. to 1600° C., preferably of 400° C. to 1000° C., in a nitrogen-containing atmosphere such as, for example, $N_2$-and/or $NH_3$-containing atmosphere at a partial pressure of the nitrogen-containing component of 0.1 to 100 bar for up to 100 hours, preferably for 10 to 24 hours. During roasting, the free aluminum is converted into aluminum nitride. Carbon in very finely dispersed form, for example as soot, can be added to the ground powder in amounts of up to 10% by weight, preferably of up to 1% by weight. This achieves the nitriding of the aluminum oxide contained in the powder. The nitriding can be carried out in various ways, for example, depending on the type of furnace used. While, for example, a vacuum furnace makes only batchwise nitriding possible, a fluidized-bed furnace, for example, permits continuous nitriding.

After the roasting times mentioned, the proportion of unreacted metallic aluminum is usually less than 0.1% by weight. In amounts of less than 0.5% by weight, metallic aluminum is not troublesome in the production of new evaporation boats. More than 0.5% by weight of metallic aluminum results in a continuous deterioration of the evaporation boat properties in the production of new evaporator boats. An aluminum content of more than 1% by weight causes marked losses in the property profile of the evaporation boats.

Evaporation boats can be produced by known methods such as, for example, hot pressing or hot isostatic pressing from the powders obtained.

Compared with the known method, the method according to the invention has the following advantages: The reprocessing method according to the invention does not produce either liquid or solid waste. The adherent aluminum containing waste hitherto disposed of is reutilized as raw material. The heat treatment in nitrogen-containing atmosphere converts aluminum and/or aluminum-containing compounds into aluminum nitride, a typical evaporator raw material. An entrainment of contaminants and quality losses resulting therefrom during the reprocessing are eliminated. Additionally, the method according to the invention is very economical.

The method of reprocessing according to the invention increases the AlN content of the powder mixture compared with the starting mixture. In order to obtain the starting mixture for the evaporation boats used or the optimum mixture desired for the particular evaporation boat and known from the prior art, it is usually necessary to mix the material with additional $TiB_2$ and/or BN and/or AlN powder.

The powder obtained by the method described may also be added proportionately to the usual standard powder mixtures for evaporation boats.

In all cases, the powders can be utilized for example, by hot pressing or hot isostatic pressing to produce evaporation boats again.

Compared with known evaporation boats, evaporation boats containing reprocessed powder exhibit during operation, surprisingly, advantages in use, in particular in the control of the evaporation method. Because of the drop in resistance due to aging during the operation of evaporation boats, it is generally necessary to readjust the power with which the evaporator is heated in order to ensure a uniform evaporation of the metal.

Surprisingly, it has now been found that the material aging during use decreases if boats contain reprocessed material which has already been sintered once. As a result, even a proportion of 50% by weight of reprocessed material results in a marked retardation of the drop in resistance. This makes it possible to readjust the evaporator power more exactly and, consequently, to control the evaporation method more satisfactorily.

The following examples are illustrative of the invention:

EXAMPLE 1

Two batches of used evaporation boats were each reprocessed separately as described below. Batch 1 was composed of evaporation boats made of $AlN/TiB_2/BN$. Batch 2 was composed of evaporation boats made of $TiB_2/BN$. The batch was comminuted using a jaw crusher. The coarse component was removed by means of a 1000 $\mu$m sieve and returned to the jaw crusher for further comminution. The fine component was comminuted further in a jet pulverizer. After termination of the grinding in the jet pulverizer at a particle size of less than 100 $\mu$m, the powder was homogenized for 2 hours in a rotating cube mixer. The starting mixture was roasted in ceramic crucibles in an oxygen-free nitrogen atmosphere for 24 hours at a pressure of ½ to 1 bar and at 1000° C. An analysis revealed a residual content of 0.09% free aluminum for both batches.

The treatment resulted in batches for the following composition (in % by weight):

| (Batch I) | (Batch II) |
|---|---|
| 22.5% AlN | 3.5% AlN |
| 28% BN | 47.5% BN |
| 49.5% $TiB_2$ | 49% $TiB_2$ |

EXAMPLE 2

The recycling powder produced in accordance with Example 1 (batch I) having the composition (in % by weight) 49.5% $TiB_2$, 28 BN, 22.5% AlN was mixed in the following manner so as to produce the standard composition of 50% $TiB_2$, 30% BN, 20% AlN:

To produce 20 kg of evaporator raw material, 1.35 kg of $TiB_2$ powder and 1.15 kg of BN powder were added to 17.5 kg of recycled material and mixed for 1 h in a plastic vessel containing steel balls on a roller bracket. After the conventional hot pressing method in graphite molds, the powder was compacted at 1950° C. and a specific pressure of 8.0 MPa. The finished evaporator body of 180 mm diameter and 200 mm height had a density of 96.1±0.3 % of the theoretical density.

An evaporation boat having the dimensions 110 mm×20 mm×10 mm was cut out of the block and provided with a 70 mm×15 mm×2 mm recess. The electrical resistivity of the evaporation boat was 920 $\mu\Omega$ cm. In a high-temperature test involving the evaporation of aluminum, the evaporation boat exhibited the same wetting behavior and the same service life as a similar evaporation boat made of new raw materials. However, the drop in resistance of the evaporator according to the invention during the high-temperature test was about 30% lower than that of evaporation boats made of new raw materials.

EXAMPLE 3

The recycling powder produced in accordance with Example 1 (batch I) was added to 15.0% by weight of a mixture made of new powder, the initial weighed amounts being adjusted in such a way that the standard mixture specified in Example 2 resulted. Mixing and hot pressing were carried out as in Example 2. The density of the finished body was 96.4±0.3%. The boat produced in accordance with Example 2 had an electrical resistivity of 960 $\mu\Omega$ cm. The behavior of this boat during the high-temperature test showed no differences compared to evaporation boats made of new raw materials.

EXAMPLE 4

The recycling powder produced in accordance with Example 1 (batch II) having the composition (in % by weight) 49% $TiB_2$, 47.5% BN, 3.5% AlN was mixed so as to produce the standard composition of 50% $TiB_2$, 30% BN, 20% AlN. To obtain a 20 kg mix, 3.8 kg of $TiB_2$ powder and 3.6 kg of AlN powder were added to a 2.6 kg of recycled material and, as explained in Example 2, mixed on a roller bracket and hot-pressed. The density of the finished body was 96.2±0.3%. The boat produced in accordance with Example 2 had an electrical resistivity of 930 $\mu\Omega$ cm. The drop in resistance during the high-temperature test was approximately 10% lower than for an evaporation boat made of new raw materials; in other respects, no differences were found.

We claim:

1. A method for reprocessing ceramic evaporation boats, which comprises comminuting used, aluminum-contaminated ceramic evaporation boats and roasting them in a nitrogen-containing atmosphere.

2. The method as claimed in claim 1, wherein the evaporation boats are comminuted to particle sizes of less than 1000 $\mu$m.

3. The method as claimed in claim 1 wherein the used evaporation boats contain titanium boride and boron nitride.

4. The method as claimed in claim 1, wherein the nitrogen-containing atmosphere is $NH_3$ or $N_2$.

5. The method as claimed in claim 1 wherein roasting is carried out at a temperature of between about 400° and about 1000° C. over a period of time of up to about 100 hours.

6. The method as claimed in claim 1 wherein up to 10% by weight of carbon in finely dispersed form is added before roasting.

7. A powder mixture produced by the method as claimed in claim 1.

8. The powder mixture as claimed in claim 7, wherein the content of free aluminum is less than 0.5% by weight.

9. An evaporation boat comprised of a powder mixture as claimed in claim 7.

10. A method for preparing a ceramic evaporation boat from used, aluminum-contaminated ceramic evaporation boat, which comprises comminuting to a powder used, aluminum-contaminated ceramic evaporation boats, roasting said powder in a nitrogen-containing atmosphere, mixing said powder with at least one additional powder selected from the group consisting of AlN, $TiB_2$ and BN and forming said powders into an evaporation boat.

* * * * *